United States Patent [19]

Welz

[11] 4,327,324

[45] Apr. 27, 1982

[54] ANTI-THEFT ELECTRIC METER

[75] Inventor: Ronald C. Welz, Cerritos, Calif.

[73] Assignee: Southern California Edison Company, Rosemead, Calif.

[21] Appl. No.: 147,198

[22] Filed: May 6, 1980

[51] Int. Cl.³ .................. G01R 11/24; G01R 11/02; B60T 7/12

[52] U.S. Cl. .................. 324/110; 188/139; 324/137;

[58] Field of Search .............. 324/110, 137, 157, 156; 361/369, 370, 371; 188/82.8, 139, 174

[56] References Cited

U.S. PATENT DOCUMENTS

| 3,915,112 | 10/1975 | Forester | 324/110 |
|---|---|---|---|
| 4,034,290 | 7/1977 | Warren | 324/110 |
| 4,039,943 | 8/1977 | Tapscott | 324/110 |
| 4,104,588 | 8/1978 | Westberry | 324/110 |

OTHER PUBLICATIONS

Westinghouse Catalog 42-300; pp. 1 & 2, Dec., 1976.
Westinghouse Brochure SA-6794D4S, "High Security Meter", 4 pages.

Primary Examiner—Ernest F. Karlsen
Attorney, Agent, or Firm—Lyon & Lyon

[57] ABSTRACT

A watthour meter with a rotatable metering movement responsive to the flow of energy through the meter includes a gravity activatable contact or stop element to engage the metering movement when the meter is inverted for preventing deregistration of consumed energy. Latching means can lock the element in a position showing that the meter had been inverted.

10 Claims, 5 Drawing Figures

ANTI-THEFT ELECTRIC METER

BACKGROUND

This invention relates to watthour meters. In particular, the invention is directed to preventing the tampering with a meter thereby leading to the theft of electrical energy.

A problem which besets utility companies is the theft of energy achieved by meter tampering. One manner of stealing electricity is to reorientate a wattmeter to cause it to run backwards, thereby causing deregistration of energy usage. This reorientation requires that the meter be removed from its upright position in its socket and thereafter be reinstalled in an inverted position. Electric power service is maintained through the inverted meter and a rotating metering movement in the meter. The metering movement is rotated in the reverse direction because the line conductors are connected in reverse through the meter during this physical reorientation. Consequently, as electricity is used, the meter dials are driven reversedly indicating reduced consumption, when in fact, electrical energy is actually being consumed. This reverse rotation of the metering movement in the inverted position is caused due to the reverse connection of the meter windings across the line conductors, thereby causing a phase reversal in the winding magnetic field driving the metering movement. With the increasing expense of energy, this thieving is becoming of a more serious nature.

One known method of overcoming the orientation, as described in U.S. Pat. Nos. 4,034,290 (Warren) and 4,104,588 (Westberry) is to provide mating the meter mounting means and socket combinations that permit a meter to be plugged into the socket in such an orientation only. This is economical only in new installations because of the expenses involved in removing standard meter installations and the replacement with newly designed meters.

Another known means is a "red flag" indicator used to show that a meter has been stopped as shown in U.S. Pat. No. 3,915,112. A problem with such a meter is that during shipping, the indicator can be tripped with the result that the meter seal must be broken and the cover removed to reset the flag before the meter can be operated. The cover seal is the manufacturer's guarantee of accuracy of the meter and when broken, the meter must be retested before it can be resealed. This would result in additional time and expense.

U.S. Pat. No. 4,039,943 (Tapscott) discloses a gravity actuated switch for reversing the meter voltage winding connections when a meter is inverted thereby retaining the same rotational movement of the metering movement. Such a meter is relatively complex and accordingly expensive. Reference is made in Tapscott (column 1, line 38-45) to a meter by Westinghouse Electric Corporation style number 285 A 082 G02 employing a detent assembly to prevent meter movement rotation in reverse. Such a device is mechanically linked to the motor assembly and is responsive to motor operation and is hence relatively complex and accordingly expensive.

In view of this, there is a need for an economical anti-theft meter which does not have encumbent in it the problems with devices known in the art, and which is yet reliable in operation, which can be supplied to new meters and also retrofitted to installed meters.

SUMMARY OF INVENTION

The present invention is directed to an anti-theft watthour meter that satisfies these needs. The meter includes a meter movement rotatable in response to the flow of energy in a pair of line conductors connected to terminals from the meter, in which reverse connection of the conductors with the terminals normally causes reverse rotation of the metering movement. Forward rotation of the movement occurs on upright mounting of the meter, and reverse rotation occurs on inverse mounting of the meter. There is included a stop element which is disengaged from the metering movement when the meter is connected forwardly with the line conductors. The stop element is adapted to engage the meter movement when the meter is reversibly connected with the line conductors. The stop element is a gravity responsive arm pivotally mounted or movement between the engaging and disengaging positions.

In one version of the invention, the gravity responsive arm is a contact element which frictionally engages the movement. A frictional material can be applied to the engaging surface of the contact arm, and the meter movement can provide a roughened surface to enhance resistance to reverse motion.

The pivotally mounted arm can be mounted on the rear of a face plate for displaying meter readings.

DRAWINGS

These and other features, aspects and advantages of the present invention will become better understood with reference to the following description, appended claims, and accompanying drawings where:

DESCRIPTION

Figure 1:
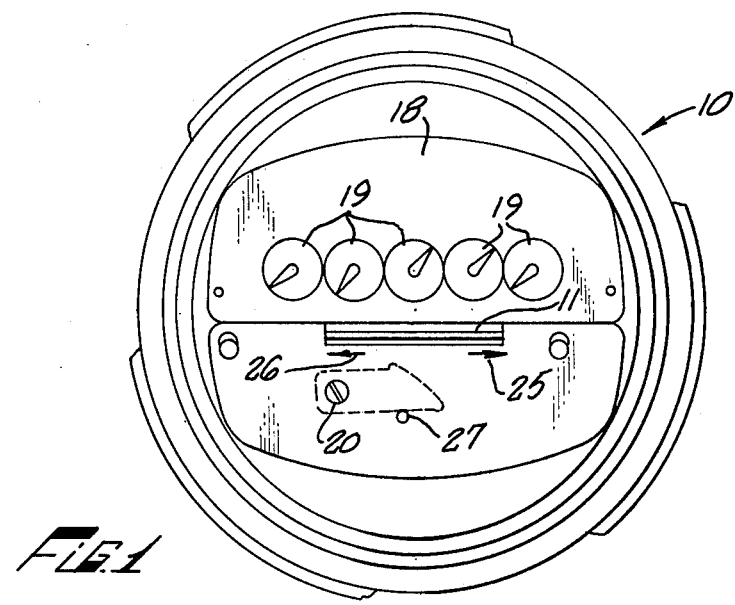
FIG. 1 is a front view of a watthour meter illustrating in phantom line behind the face plate a gravity responsive contact, the meter being in upright position.

A watthour meter 10 includes a metering movement 11 which is rotatable in response to the flow of energy in a pair of line conductors 28 connected to terminals for electrically connecting the line conductors so that current flowing through the conductors passes through the meter. Stud means 12 for mounting the meter in a socket and in some cases the terminals constitute part of the mounting means to ensure firm location of the meter within the socket. The mounting studs 12 project rearwardly from the base 13 of the meter 10.

The metering movement 11 is a rotatable disc having a roughened surface 14 on the planar face 15. The roughened surface 14 describes a circle about rotational axis 16. The disc, which can conveniently be made of aluminum or similar material, rotates in response to magnetic flux generated by a winding, the current through which is proportional to the current flow through the line conductors. Hence the greater the current flow, the faster the rotation of the metering movement 11.

Figure 2:
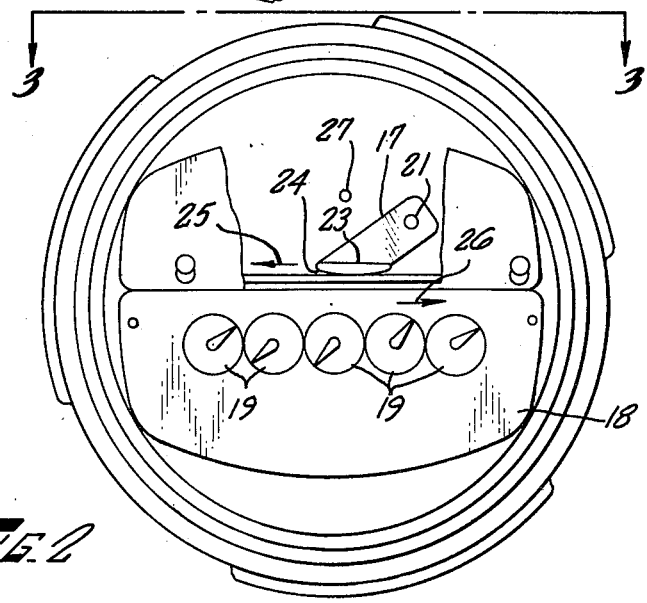
FIG. 2 is a front view of the meter of FIG. 1 with portions of the face plate removed, illustrating the gravity responsive contact in engagement with a metering movement, the meter being in an inverted position.
Figure 3:
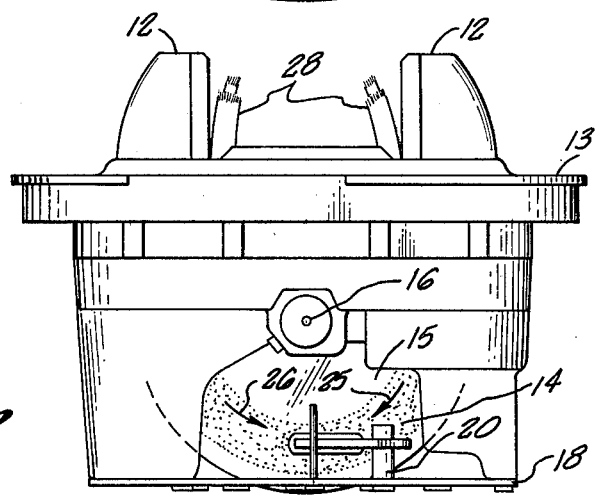
FIG. 3 is a side view of the meter of FIG. 1 along line 3—3 of FIG. 2 illustrating the surface of the metering movement and the contact element.

A gravity responsive contact element in the form of a pivotally mounted arm 17 is located between a contact position engaging the surface 14 when the meter 10 is inverted, as illustrated in FIG. 2, and a spaced position disengaging the surface 14 when the meter is upright, as illustrated in FIG. 1. On the forward part of the meter 10 is a face plate 18 on which meter dials 19 are displayed. A pivotal screw 20 passes through the plate 18 to form a fulcrum 21 for the arm 17.

The forward end of the arm is provided with a broadened surface 23 which is effectively achieved by obliquely cutting the arm 17. The angle of the surface 23 is chosen to be parallel with the face 15 when the arm 17 is in engagement with the surface 14 as indicated in FIG. 2. Over the broadened surface 23, there is fitted a shoe of frictional material 24 which acts to enhance the resistant effect to reverse motion of the metering movement 11.

The mounting is such that the pivotal arm 17 is free to permit forward rotation of the metering movement 11, even in the inverted position of the meter 10. Such forward motion is indicated by arrow 25, and reverse motion is indicated by arrow 26. The arm 17 rides over the roughened surface 14 of the metering movement 11 in forward movement.

Also mounted on the face plate 18 is a pin 27 on which the arm 17 rests when the meter is upright and the arm is disengaged from the metering movement 11.

Figure 4:
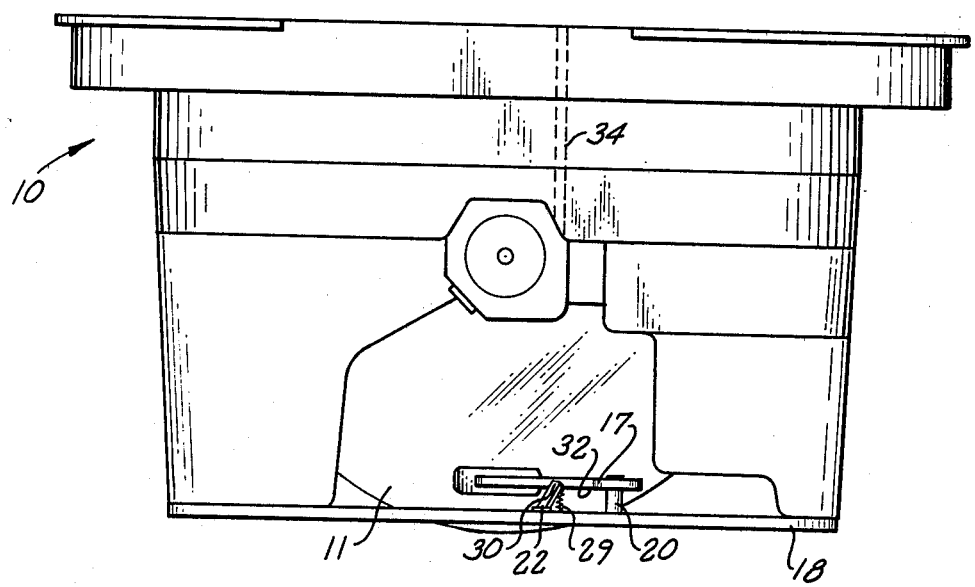
FIG. 4 is a side view of a second embodiment of the meter illustrating a latching device to prevent retraction of the contact element to the preinverted position after inversion.
Figure 5:
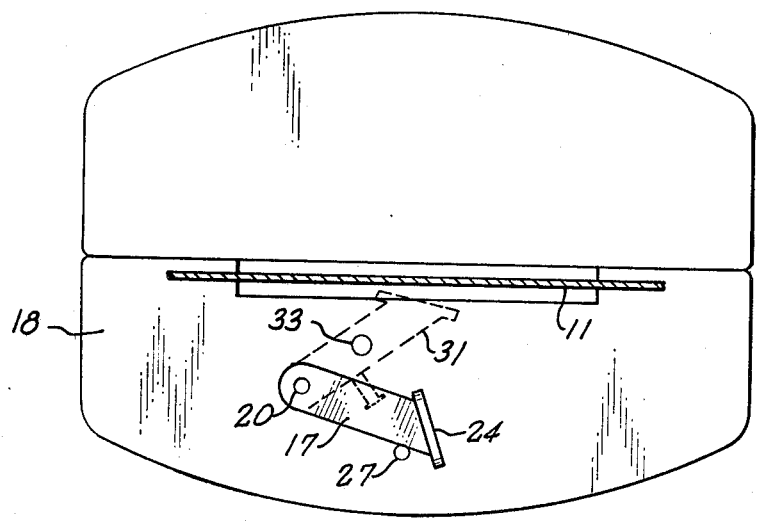
FIG. 5 is a rear view of the meter illustrated in FIG. 4 illustrating the retracted and partially retracted positions of the contact element.

In FIG. 4 there is a latching device which includes a lever 22 which is biased by means of a spring 29 to an extended position remote from the meter face. When the meter is in the upright position the arm 17 holds down and retains the free end 30 of the lever 22 so that the lever 22 does not prevent movement of the arm 17. On inversion, the arm moves under gravity to the rotating surface 14, and the lever 22 is urged outwardly by the spring 29 into the path of movement of arm 17. On returning the meter to its upright position, the lever 22 permits only partial retraction of arm 17 to its pre-inverted position, this partially retracted position being shown by phantom line 31. The face 32 of arm 17 is visible through a sight hole 33 in the meter face 18 and hence a meter reader can determine that the meter has been inverted. Resetting of the lever 22 and arm 17 is effected by a tool passed through aperture 34 in the base of the meter by which the lever 22 can be urged back to its retracted position against the spring 29.

In operation of the meter in the upright position, the arm 17 rests against pin 27 as the current flows forwardly through the meter 10 and the line connections to the terminals are such that the current passing through the flux generating winding causes forward rotation 25 of the metering movement 11. When the meter is inverted, as indicated in FIG. 2, the line connections to the terminals are also inverted and the current flow through the winding is reversed hence causing the metering movement 11 to reverse as indicated by arrow 26. The arm 17 falls under gravity to contact the metering movement 11 and thereby prevents the reverse rotation 26 of the metering movement 11.

The advantages of the invention include the provision of a device for easily preventing tampering of the meter, and a means for identifying such tampering after the tampering. Such means can be installed or retrofitted without excessive expense.

Although the present invention has been described in considerable detail with reference to certain preferred versions thereof, other versions are possible. For instance, instead of a pivotally mounted arm which is gravity responsive, an alternative gravity responsive mechanism could be employed such as a gravity responsive piston in a cylinder. Instead of engaging the planar face 15 of the metering movement, the engagement can be on the peripheral edge of the rotating movement.

The frictional material could be affixed to the end of the pivotal arm in any desired fashion, for instance, a hot melt glue may be used.

Therefore, the spirit and scope of the appended claims should not be limited to the description of the preferred version obtained herein.

What is claimed is:

1. In a watthour meter including a metering movement adapted to rotate in response to the flow of energy in a pair of line conductors connected to terminals from the meter, reverse connection of the conductors with the terminals causing reverse rotation of the metering movement, forward rotation of the movement occurring on upright mounting of the meter, and reverse rotation occurring on inverse mounting of the meter, the improvement comprising a gravity responsive stop element adapted to be spaced from the metering movement when the meter is connected forwardly with the line conductors, and adapted to contact the metering movement when the meter is reversibly connected with the line conductors for preventing reverse rotation of the metering movement.

2. A watthour meter as claimed in claim 1 wherein the stop element is an arm pivotally mounted for movement between the spaced position and contact position.

3. A watthour meter having a metering movement rotatable in response to the flow of electrical energy in a pair of line conductors, said meter comprising:
   means for mounting said meter and electrically connecting said meter with the line conductors;
   a winding responsive to the electrical current in the line conductors;
   the mounting means permitting upright mounting of the meter and forward electrical connection with the conductors, or inverted mounting of the meter and reverse electrical connection with the conductors whereby the winding acts to cause forward or reverse rotation of the metering movement, and
   a gravity responsive contact element mounted to contact the metering movement when the meter is inverted whereby reverse rotation of the movement is prevented.

4. A watthour meter as claimed in claim 3 wherein the gravity responsive contact element is retained in a position remote from the rotatable metering movement when the meter is upright.

5. A watthour meter as claimed in claim 4 wherein the contact element frictionally engages the movement.

6. A watthour meter as claimed in claim 5 wherein the contact element is a pivotally mounted arm.

7. A watthour meter as claimed in claim 6 wherein the arm includes an end having a broadened surface for contacting the movement, a shoe of frictional material being located on the end.

8. A watthour meter as claimed in either claim 5, 6 or 7 including a latching means for locking the stop element in a position remote from its position assumed with the meter initially upright, and a sight hole in a face to the meter through which said stop element is visible.

9. A watthour meter as claimed in either claim 5, 6 or 7 wherein the movement provides a roughened surface to enhance the preventive effect of the contact element when in contact with the movement.

10. A watthour meter as claimed in claim 3, wherein the meter includes a face plate for displaying meter readings, and the element is mounted on the face plate.

* * * * *